United States Patent
Chi et al.

(10) Patent No.: US 7,880,094 B2
(45) Date of Patent: Feb. 1, 2011

(54) DIFFERENTIAL SIGNAL LAYOUT PRINTED CIRCUIT BOARD

(75) Inventors: Cheng-Jan Chi, Taipei (TW); Wen-Cheng Ko, Taipei (TW); Sheng-Ming Chang, Taipei (TW); Chih-Wei Tsai, Taipei (TW)

(73) Assignee: ASUSTeK Computer Inc., Peitou, Taipei (TW)

( * ) Notice: Subject to any disclaimer, the term of this patent is extended or adjusted under 35 U.S.C. 154(b) by 929 days.

(21) Appl. No.: 11/790,617

(22) Filed: Apr. 26, 2007

(65) Prior Publication Data

US 2008/0264673 A1 Oct. 30, 2008

(30) Foreign Application Priority Data

Apr. 26, 2006 (TW) ............................... 95114927 A

(51) Int. Cl.
*H01R 12/04* (2006.01)
*H05K 1/11* (2006.01)
(52) U.S. Cl. ....................................... 174/261; 361/792
(58) Field of Classification Search ................. 174/261; 361/792–795
See application file for complete search history.

(56) References Cited

U.S. PATENT DOCUMENTS 6,677,832 B1 1/2004 Guinn et al.
7,478,472 B2 * 1/2009 Lauffer et al. ................. 29/830

FOREIGN PATENT DOCUMENTS

| JP | 2004-48750 A | 2/2004 |
|---|---|---|
| TW | 438198 | 5/2001 |
| TW | 547894 | 8/2003 |
| TW | 1228021 B | 2/2005 |

OTHER PUBLICATIONS

Manfred Kirschning and Rolf Jansen, "Accurate Wide-Range Design Equations for the Frequency-Dependent Characteristic of Parallel Coupled Microstrip Lines," IIEEE Transactions on Microwave Theory and Techniques, vol. MTT-32, No. 1, Jan. 1984.
Differential Impendance Calculator Screenshots, http://www.ultracad.com/diff_calc_screenshots.htm.

* cited by examiner

*Primary Examiner*—Jeremy C Norris
(74) *Attorney, Agent, or Firm*—Winston Hsu; Scott Margo

(57) ABSTRACT

A positive differential signal trace and a negative differential signal trace are formed on different layers of a printed circuit board. A first ground trace is formed on the layer on which the positive differential signal trace is formed, and a second ground trace is formed on the layer on which the negative differential signal trace is formed. An insulation layer is positioned between the two layers and has a predetermined thickness. A differential mode impedance and a common mode impedance of differential signals are dependent on the predetermined thickness of the insulation layer, width and thickness of each differential signal trace, and a space between each differential signal trace and the corresponding ground trace formed on the same layer.

20 Claims, 13 Drawing Sheets

| Isolation layer thickness | S(mil) | W(mil) | Differential-mode impedance | Common-mode impedance | Result |
|---|---|---|---|---|---|
| 10 mil | 5 | 10 | 79.30 | 35.13 | Pass |

| Isolation layer thickness | S(mil) | W(mil) | Differential-mode impedance | Common-mode impedance | Result |
|---|---|---|---|---|---|
| 20 mil | 5 | 10 | 100.30 | 31.53 | Pass |
| 20 mil | 5 | 15 | 85.63 | 29.57 | Pass |

| Isolation layer thickness | S(mil) | W(mil) | Differential-mode impedance | Common-mode impedance | Result |
|---|---|---|---|---|---|
| 30 mil | 5 | 15 | 94.56 | 28.29 | Pass |
| 30 mil | 5 | 20 | 85.10 | 26.96 | Pass |
| 30 mil | 5 | 25 | 77.70 | 26.11 | Pass |
| 30 mil | 10 | 20 | 100.82 | 36.88 | Pass |
| 30 mil | 10 | 25 | 90.79 | 35.62 | Pass |
| 30 mil | 10 | 30 | 82.74 | 34.72 | Pass |

| Isolation layer thickness | S(mil) | W(mil) | Differential-mode impedance | Common-mode impedance | Result |
|---|---|---|---|---|---|
| 40 mil | 5 | 15 | 98.82 | 27.81 | Pass |
| 40 mil | 5 | 20 | 90.14 | 26.30 | Pass |
| 40 mil | 5 | 25 | 83.36 | 25.31 | Pass |
| 40 mil | 5 | 30 | 77.78 | 24.62 | Pass |
| 40 mil | 10 | 25 | 100.22 | 33.99 | Pass |
| 40 mil | 10 | 30 | 92.41 | 32.96 | Pass |
| 40 mil | 10 | 35 | 85.90 | 32.22 | Pass |
| 40 mil | 10 | 40 | 80.34 | 31.63 | Pass |
| 40 mil | 15 | 35 | 92.11 | 38.58 | Pass |
| 40 mil | 15 | 40 | 85.81 | 37.85 | Pass |
| 40 mil | 15 | 45 | 80.36 | 37.24 | Pass |

Fig. 5

| Isolation layer thickness | S(mil) | W(mil) | Differential mode impedance | Common mode impedance | Result |
|---|---|---|---|---|---|
| 50 mil | 5 | 15 | 101.10 | 27.60 | Pass |
| 50 mil | 5 | 20 | 92.99 | 25.99 | Pass |
| 50 mil | 5 | 25 | 86.67 | 24.90 | Pass |
| 50 mil | 5 | 30 | 81.49 | 24.12 | Pass |
| 50 mil | 5 | 35 | 77.07 | 23.54 | Pass |
| 50 mil | 10 | 30 | 98.73 | 31.98 | Pass |
| 50 mil | 10 | 35 | 92.44 | 31.13 | Pass |
| 50 mil | 10 | 40 | 87.07 | 30.48 | Pass |
| 50 mil | 15 | 35 | 100.51 | 36.94 | Pass |
| 50 mil | 15 | 40 | 94.27 | 36.15 | Pass |
| 50 mil | 10 | 45 | 82.36 | 29.96 | Pass |
| 50 mil | 10 | 50 | 78.18 | 29.53 | Pass |
| 50 mil | 15 | 45 | 88.81 | 35.51 | Pass |
| 50 mil | 15 | 50 | 84.06 | 35.00 | Pass |
| 50 mil | 15 | 55 | 79.81 | 34.56 | Pass |
| 50 mil | 20 | 60 | 78.86 | 38.78 | Pass |

Fig. 6

| Isolation layer thickness | S(mil) | W(mil) | Differential-mode impedance | Common-mode impedance | Result |
|---|---|---|---|---|---|
| 61 mil | 5 | 15 | 102.66 | 27.49 | Pass |
| 61 mil | 5 | 20 | 94.92 | 25.81 | Pass |
| 61 mil | 5 | 25 | 88.98 | 24.65 | Pass |
| 61 mil | 5 | 30 | 84.16 | 23.81 | Pass |
| 61 mil | 5 | 35 | 80.05 | 23.17 | Pass |
| 61 mil | 10 | 30 | 103.43 | 31.31 | Pass |
| 61 mil | 10 | 35 | 97.52 | 30.40 | Pass |
| 61 mil | 10 | 40 | 92.39 | 29.67 | Pass |
| 61 mil | 10 | 45 | 87.86 | 29.08 | Pass |
| 61 mil | 10 | 50 | 83.86 | 28.62 | Pass |
| 61 mil | 10 | 55 | 80.26 | 28.23 | Pass |
| 61 mil | 10 | 60 | 76.99 | 27.90 | Pass |
| 61 mil | 15 | 40 | 101.26 | 34.95 | Pass |
| 61 mil | 15 | 45 | 95.90 | 34.23 | Pass |
| 61 mil | 15 | 50 | 91.22 | 33.66 | Pass |
| 61 mil | 15 | 55 | 87.01 | 33.18 | Pass |
| 61 mil | 15 | 60 | 83.19 | 32.76 | Pass |
| 61 mil | 15 | 65 | 79.76 | 32.42 | Pass |
| 61 mil | 15 | 70 | 76.76 | 32.11 | Pass |
| 61 mil | 20 | 45 | 100.99 | 38.66 | Pass |
| 61 mil | 20 | 50 | 95.80 | 37.98 | Pass |
| 61 mil | 20 | 55 | 91.19 | 37.42 | Pass |
| 61 mil | 20 | 60 | 87.09 | 36.97 | Pass |
| 61 mil | 20 | 65 | 83.30 | 36.54 | Pass |
| 61 mil | 20 | 70 | 79.91 | 36.19 | Pass |
| 61 mil | 20 | 75 | 76.80 | 35.87 | Pass |

Fig. 7

| Isolation layer thickness | S(mil) | W(mil) | Differential mode impedance | Common mode impedance | Result |
|---|---|---|---|---|---|
| 70 mil | 5 | 15 | 103.40 | 27.45 | Pass |
| 70 mil | 5 | 20 | 95.85 | 25.74 | Pass |
| 70 mil | 5 | 25 | 90.10 | 24.55 | Pass |
| 70 mil | 5 | 30 | 85.48 | 23.67 | Pass |
| 70 mil | 5 | 35 | 81.55 | 23.00 | Pass |
| 70 mil | 5 | 40 | 78.13 | 22.47 | Pass |
| 70 mil | 10 | 35 | 100.14 | 30.04 | Pass |
| 70 mil | 10 | 40 | 95.20 | 29.27 | Pass |
| 70 mil | 10 | 45 | 90.84 | 28.63 | Pass |
| 70 mil | 10 | 50 | 86.97 | 28.15 | Pass |
| 70 mil | 10 | 55 | 83.45 | 27.73 | Pass |
| 70 mil | 10 | 60 | 80.28 | 27.38 | Pass |
| 70 mil | 10 | 65 | 77.35 | 27.07 | Pass |
| 70 mil | 15 | 45 | 99.84 | 33.58 | Pass |
| 70 mil | 15 | 50 | 95.25 | 32.98 | Pass |
| 70 mil | 15 | 55 | 91.10 | 32.46 | Pass |
| 70 mil | 15 | 60 | 87.34 | 32.02 | Pass |
| 70 mil | 15 | 65 | 83.96 | 31.66 | Pass |
| 70 mil | 15 | 70 | 80.82 | 31.32 | Pass |
| 70 mil | 15 | 75 | 77.96 | 31.05 | Pass |
| 70 mil | 20 | 50 | 100.61 | 37.09 | Pass |
| 70 mil | 20 | 55 | 96.05 | 36.50 | Pass |
| 70 mil | 20 | 60 | 91.92 | 36.00 | Pass |
| 70 mil | 20 | 65 | 88.18 | 35.57 | Pass |
| 70 mil | 20 | 70 | 84.76 | 35.20 | Pass |
| 70 mil | 20 | 75 | 81.62 | 34.86 | Pass |
| 70 mil | 20 | 80 | 78.72 | 34.56 | Pass |
| 70 mil | 25 | 70 | 87.43 | 38.69 | Pass |
| 70 mil | 25 | 75 | 84.13 | 38.33 | Pass |
| 70 mil | 25 | 80 | 81.06 | 37.98 | Pass |
| 70 mil | 25 | 85 | 78.25 | 37.69 | Pass |

Fig. 8

| Isolation layer thickness | S(mil) | W(mil) | Differential-mode impedance | Common-mode impedance | Result |
|---|---|---|---|---|---|
| 80 mil | 5 | 20 | 96.64 | 25.69 | Pass |
| 80 mil | 5 | 25 | 91.06 | 24.47 | Pass |
| 80 mil | 5 | 30 | 86.59 | 23.57 | Pass |
| 80 mil | 5 | 35 | 82.82 | 22.86 | Pass |
| 80 mil | 5 | 40 | 79.57 | 22.31 | Pass |
| 80 mil | 5 | 45 | 76.68 | 21.86 | Pass |
| 80 mil | 10 | 35 | 102.47 | 29.76 | Pass |
| 80 mil | 10 | 40 | 97.73 | 28.93 | Pass |
| 80 mil | 10 | 45 | 93.54 | 28.30 | Pass |
| 80 mil | 10 | 50 | 89.80 | 27.76 | Pass |
| 80 mil | 10 | 55 | 86.42 | 27.30 | Pass |
| 80 mil | 10 | 60 | 83.34 | 26.92 | Pass |
| 80 mil | 10 | 65 | 80.52 | 26.60 | Pass |
| 80 mil | 10 | 70 | 77.91 | 26.31 | Pass |
| 80 mil | 15 | 45 | 103.49 | 33.03 | Pass |
| 80 mil | 15 | 50 | 99.00 | 32.39 | Pass |
| 80 mil | 15 | 55 | 94.97 | 31.84 | Pass |
| 80 mil | 15 | 60 | 91.28 | 31.36 | Pass |
| 80 mil | 15 | 65 | 87.96 | 30.98 | Pass |
| 80 mil | 15 | 70 | 84.89 | 30.63 | Pass |
| 80 mil | 15 | 75 | 82.05 | 30.33 | Pass |
| 80 mil | 15 | 80 | 79.42 | 30.06 | Pass |
| 80 mil | 15 | 85 | 76.97 | 29.82 | Pass |
| 80 mil | 20 | 55 | 100.66 | 35.68 | Pass |
| 80 mil | 20 | 60 | 96.62 | 35.16 | Pass |
| 80 mil | 20 | 65 | 92.91 | 34.70 | Pass |
| 80 mil | 20 | 70 | 89.48 | 34.29 | Pass |
| 80 mil | 20 | 75 | 86.37 | 33.93 | Pass |
| 80 mil | 20 | 80 | 83.44 | 33.62 | Pass |
| 80 mil | 20 | 85 | 80.80 | 33.36 | Pass |
| 80 mil | 20 | 90 | 78.28 | 33.10 | Pass |
| 80 mil | 25 | 60 | 100.35 | 38.54 | Pass |
| 80 mil | 25 | 65 | 96.38 | 38.04 | Pass |
| 80 mil | 25 | 70 | 92.73 | 37.60 | Pass |
| 80 mil | 25 | 75 | 89.41 | 37.21 | Pass |
| 80 mil | 25 | 80 | 86.32 | 36.86 | Pass |
| 80 mil | 25 | 85 | 83.46 | 36.54 | Pass |
| 80 mil | 25 | 90 | 80.78 | 36.23 | Pass |
| 80 mil | 25 | 95 | 78.30 | 35.99 | Pass |

DIFFERENTIAL SIGNAL LAYOUT PRINTED CIRCUIT BOARD

BACKGROUND OF THE INVENTION

1. Field of the Invention

The present invention relates to printed circuit boards, and in particular, to a printed circuit board with a differential signal layout on different layers.

2. Description of the Prior Art

According to the Universal Serial Bus (USB) 2.0 specification, differential mode impedance and common mode impedance of a high speed differential signal are required to be 90 Ohms (±15%) and 30 Ohms (±30%) respectively. However, in general embodiments of edge coupling on a microstrip, a signal layer needs to be very close to a ground layer to lower impedance, and a trace width of a signal trace also varies with a space between the signal layer and the ground layer.

For example, a total thickness of a four-layer Printed Circuit Board (PCB) is approximately 62 mil in general, where 40 mil is 1 mm. A first layer is the signal layer and a second layer is the ground layer with a distance between the two layers being 4.5 mil. If the differential signal trace width and spaces between the differential signal traces are kept within appropriate distances, for instance the width is about 7 mil and the space is about 8 mil, the common mode and differential mode impedances meet the specification mentioned. However, this is difficult to apply to a typical 2-layer PCB.

Please refer to FIG. 1 and FIG. 2. FIG. 1 is a side view of a four-layer PCB 1 in the prior art, and FIG. 2 is a diagram of a signal layer 12 from the four-layer PCB 1 in FIG. 1. The PCB 1 comprises three insulation layers 11, 13, and 15, two signal layers 12 and 16, a ground layer 10, and a power layer 14. A thickness of the insulation layer 13 is larger than each thickness of the insulation layers 11 and 15. The purpose of this is that the insulation layer 13 supports the entire PCB 1 while the insulation layers 11 and 15 are used to isolate different signal layers to avoid short-circuiting. The signal layer 12 and the ground layer 10 are 4.5 mil apart, which is the thickness of the insulation layer 15.

There are a positive differential signal trace 22 and a negative differential signal trace 24 that both are disposed on the signal layer 12, and a space 20 between the two traces. Since the thickness of the insulation layer 15 is approximately 4.5 mil, the positive differential signal trace 22 and the negative differential signal trace 24 must each have widths of about 7 mil to meet the USB 2.0 specification, and therefore the space 20 will be about 8 mil. To realize this on a two layer PCB, as the signal layer 12 and the ground layer 10 need to be 4.5 mil apart, the PCB can be easily bent and it is also problematic in industrial technologies as well as not being cost effective.

SUMMARY OF THE INVENTION

A differential signal layout includes a first layer having a positive differential signal trace, and a first ground trace used for impedance matching with the differential signal. A second layer of the differential signal layout includes a negative differential signal trace in correspondence to the positive differential signal trace and a second ground trace in correspondence to the first ground trace and used for impedance matching with a differential signal. An insulation layer with a predetermined thickness is disposed between the first layer and the second layer. These and other objectives of the present invention will no doubt become obvious to those of ordinary skill in the art after reading the following detailed description of the preferred embodiment that is illustrated in the various figures and drawings.

BRIEF DESCRIPTION OF THE DRAWINGS

FIG. 5 to FIG. 9 are PCB structure simulations that agree with data of the USB 2.0 specification in accordance to FIG. 3.

DETAILED DESCRIPTION

Figure 1:
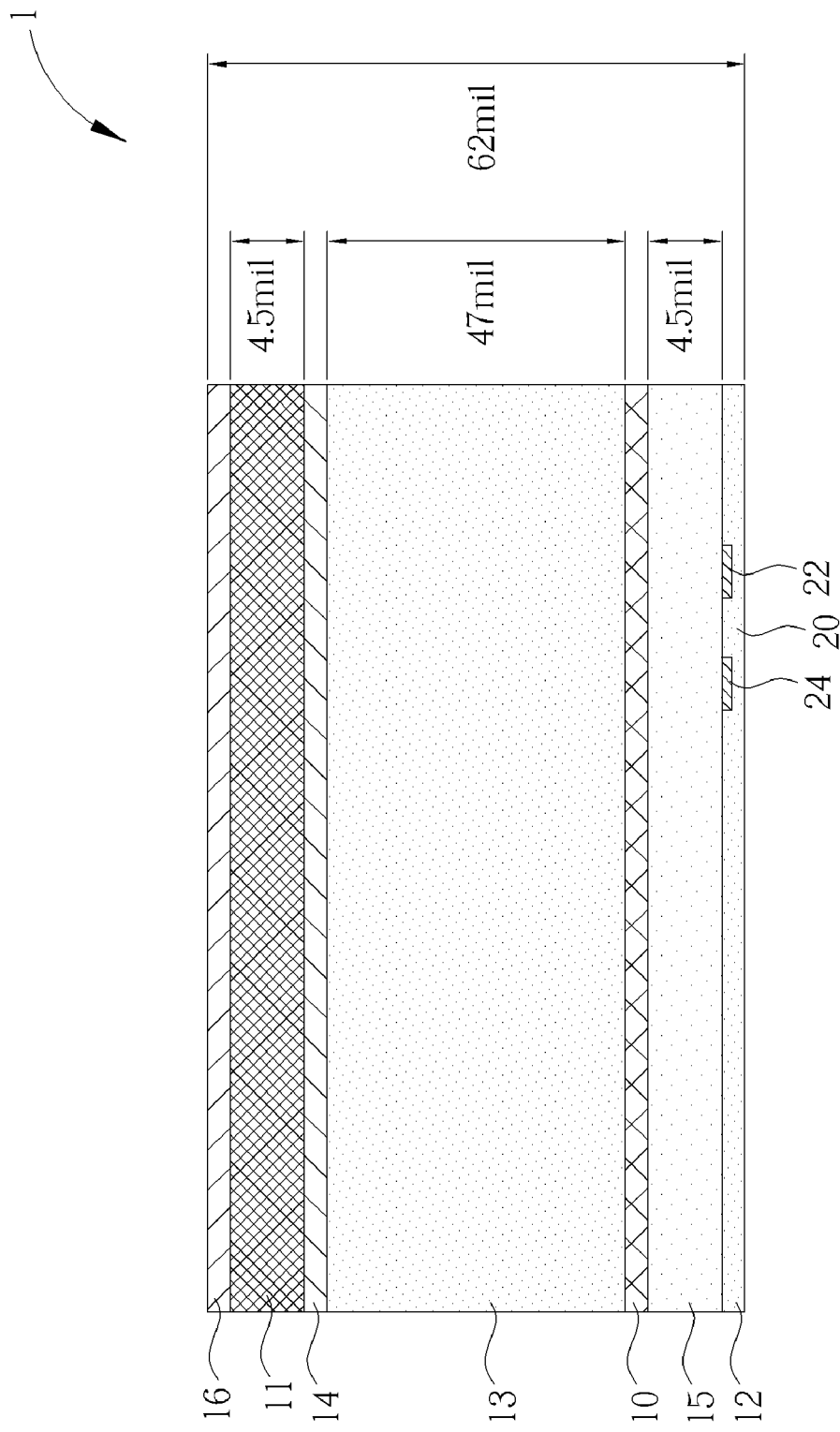
FIG. 1 is a side view of a four layer PCB in the prior art.
Figure 2:
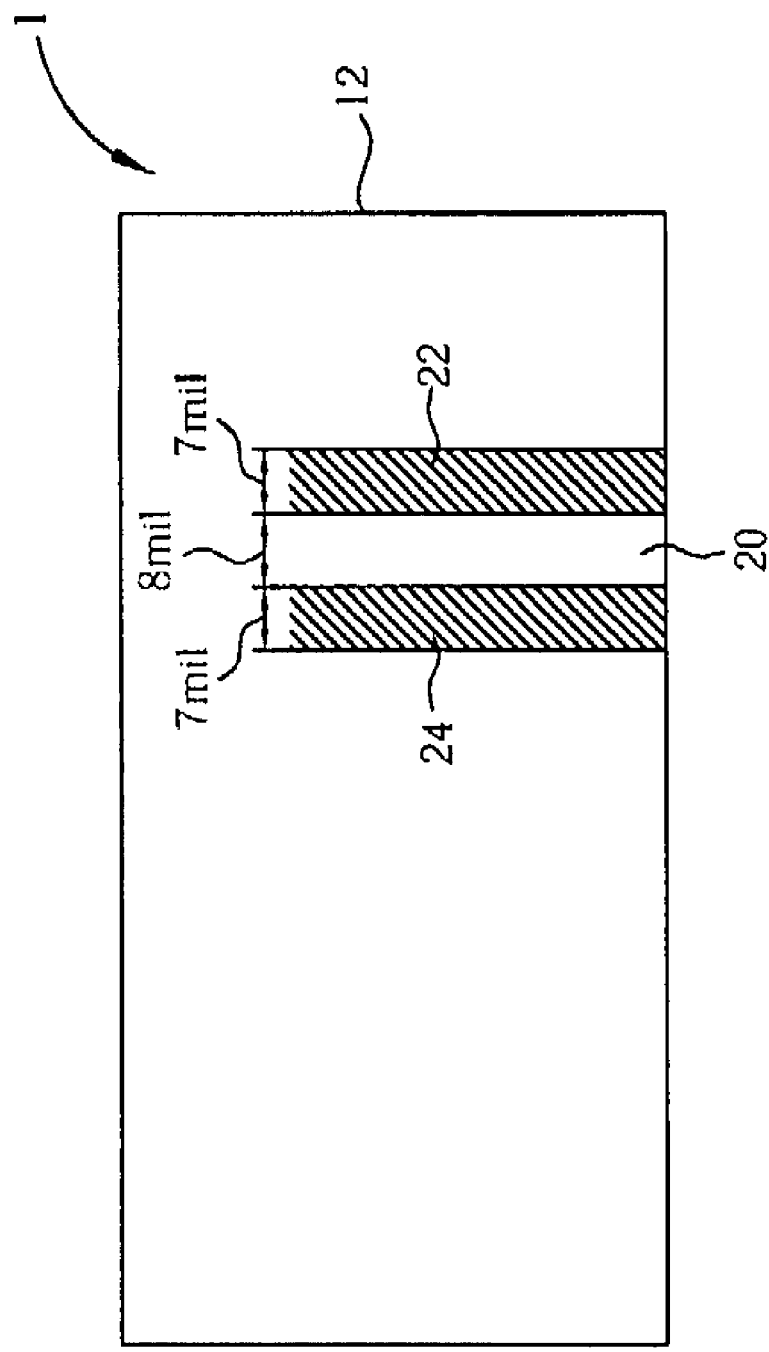
FIG. 2 is a diagram of a signal layer in FIG. 1.
Figure 3:
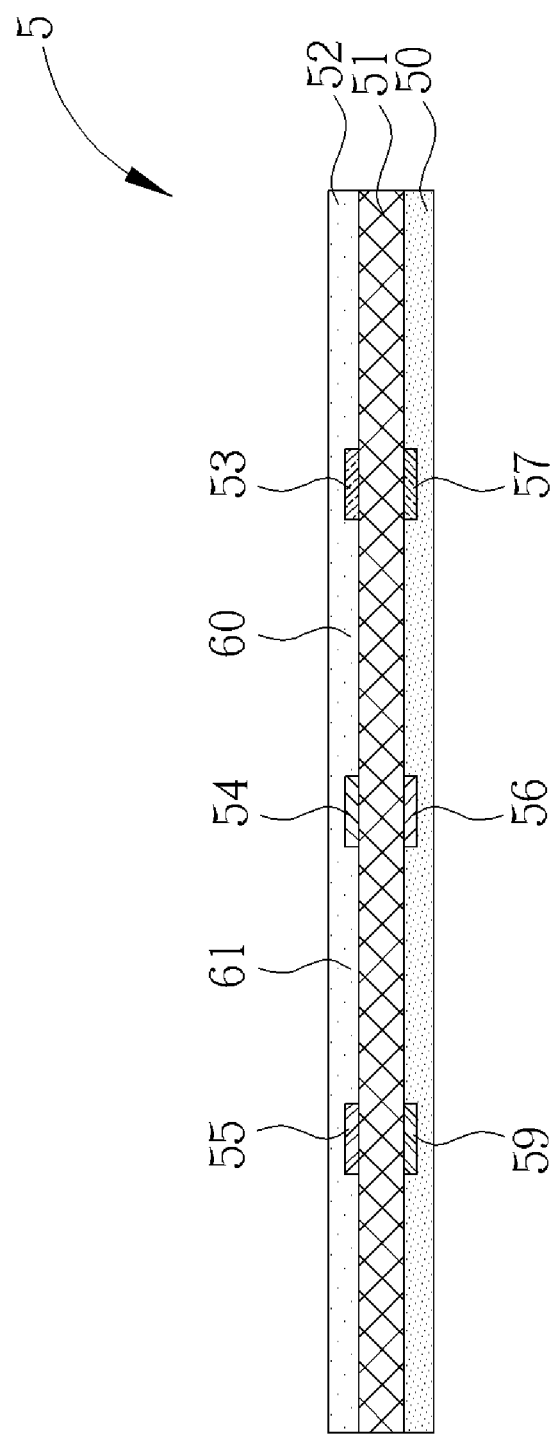
FIG. 3 and FIG. 4 are side views of PCBs for each embodiment in the present invention.

Please refer to FIG. 3. FIG. 3 is a side view of a PCB 5 in the present invention. The PCB 5 comprises an insulation layer 51, a first layer 52 and a second layer 50. The first layer 52 and the second layer 50 are disposed on two sides of the insulation layer 51. On the first layer 52 is disposed a positive differential signal trace 54 and two ground traces 53 and 55, and a space 60 between the positive differential signal trace 54 and the ground trace 53 is the same as a space 61 between the positive differential signal trace 54 and the ground trace 55. Similarly, on the second layer 50 is disposed a negative differential signal trace 56 and two ground traces 57 and 59 corresponding to the positive differential signal trace 54 and the two ground traces 53 and 55 of the first layer 52, with all traces having the same width.

Figure 4:
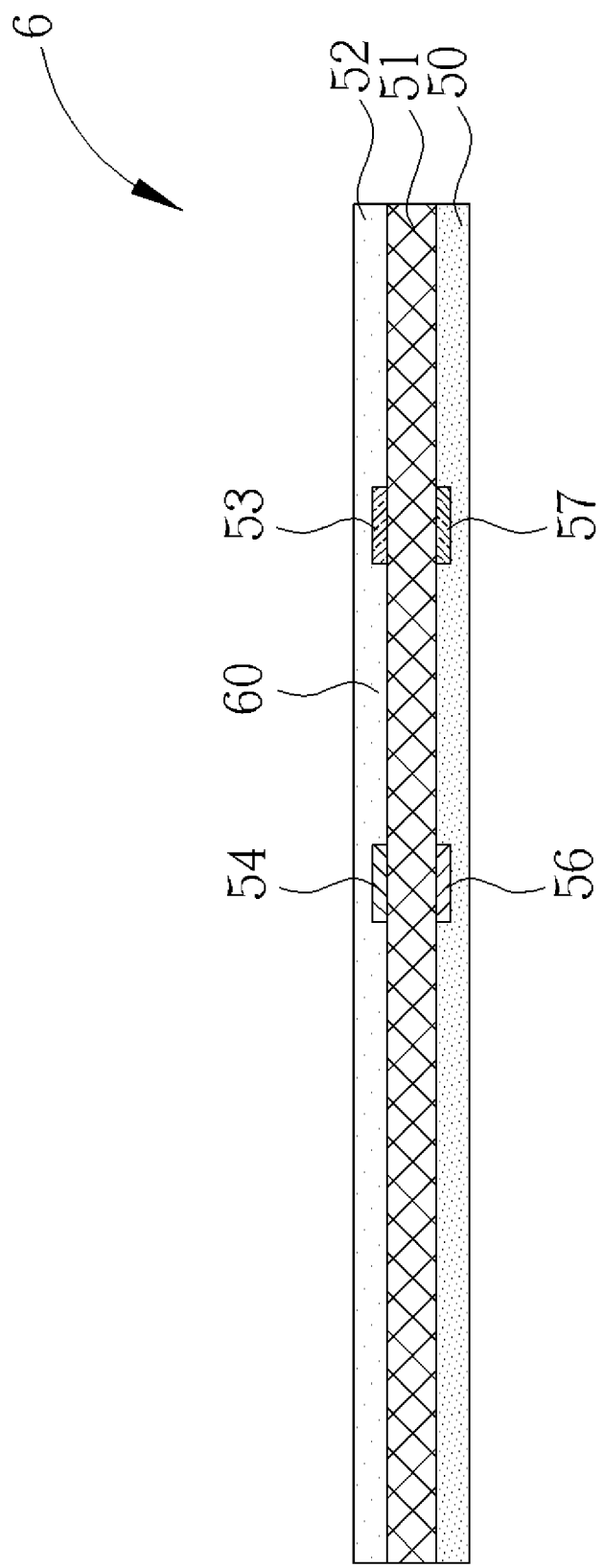

Please refer to FIG. 4. FIG. 4 is a side view of another embodiment of a PCB 6 in the present invention. The PCB 6 comprises two layers 50 and 52, and each layer 50, 52 comprises one ground trace 57 and 53, respectively. An impedance of a differential signal is hence matched through a single ground trace.

A key of the present invention is to provide a new Dual-Coplanar Waveguide (Dual-CPW) structure. The structure has the positive and negative differential traces disposed on different layers, and two sets of CPW structures disposed on two sides of a two-layer PCB and therefore achieves impedance control as well as meeting differential layout requirements, such as requirements of the USB 2.0 specification, the Local Area Network (LAN) protocol specification, the Low Voltage Differential Signal (LVDS) specification and other high speed differential signal specifications.

The present invention meets the requirements for differential signal layout in the USB 2.0 specification as follows. The common mode and differential mode impedance is determined by the thickness of the insulation layer 51, the width (W) of the signal trace, and the space (S) between the signal traces. Thus, the thickness of the insulation layer 51, the width of the signal trace, and the space between the signal traces are first simulated to meet the USB 2.0 specification, then a test is carried out according to data from the simulation. Below is a test performed on the PCB 5 shown in FIG. 3 to simulate the data.

First, parameters that meet the USB 2.0 specification are found through simulation. In the USB 2.0 specification, the differential mode impedance must be between 76.5 Ohms and 103.5 Ohms and the common mode impedance must be between 21 Ohms and 39 Ohms. Please refer to FIGS. 5-9, which represent combinations of parameters that meet the USB 2.0 specification. FIG. 5 is a table of signal trace widths and spaces between signal traces that meet the USB 2.0 specification when the insulation layer 51 is in a range of 10 mil to 40 mil. FIG. 6 is a table when the insulation layer 51 is approximately 50 mil. FIG. 7 is a table when the insulation layer 51 is approximately 61.5 mil. FIG. 8 is a table when the insulation layer 51 is approximately 70 mil. FIG. 9 is a table when the insulation layer 51 is approximately 80 mil.

Next, an eye diagram of the differential signal is simulated. In order to simulate the eye diagram of the USB differential signal, an HSPICE software is used as a simulation platform by the present invention. A pseudo-random out-of-phase bit stream is used as an input signal, a total simulation time is about 20 μs, and total data used is about 10 Kbytes. The present invention also uses an Intel ICH7 IBIS I/O model as a driver and a receiver, and a main board layout model uses a coupled lossy transmission line, taking dielectric loss and AC copper loss at 480 MHz into account. However, conneters, cables and an IC package are not considered in this simulation.

Figure 10:
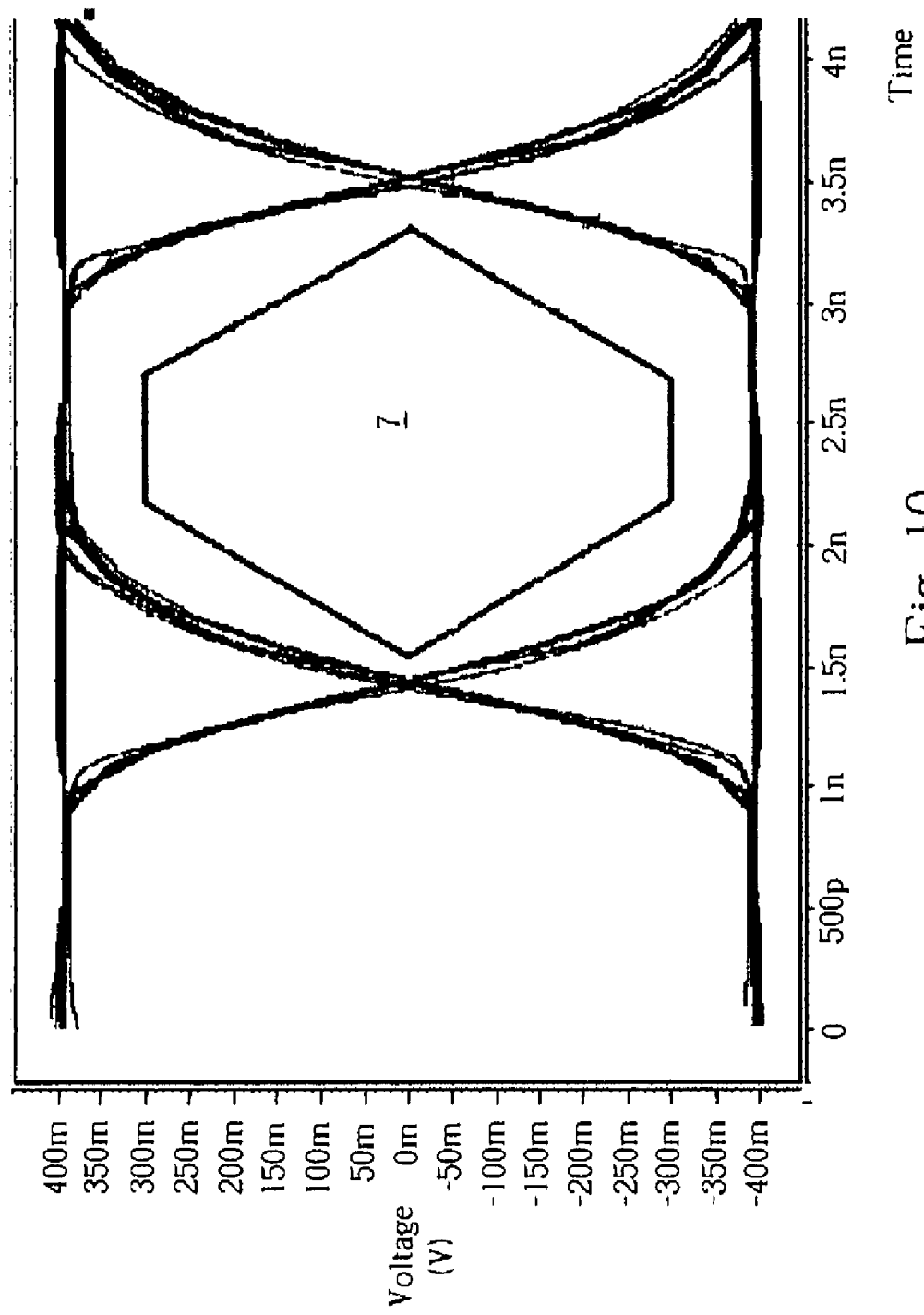
FIG. 10 and FIG. 11 are eye diagrams of simulations of the present invention.
Figure 11:
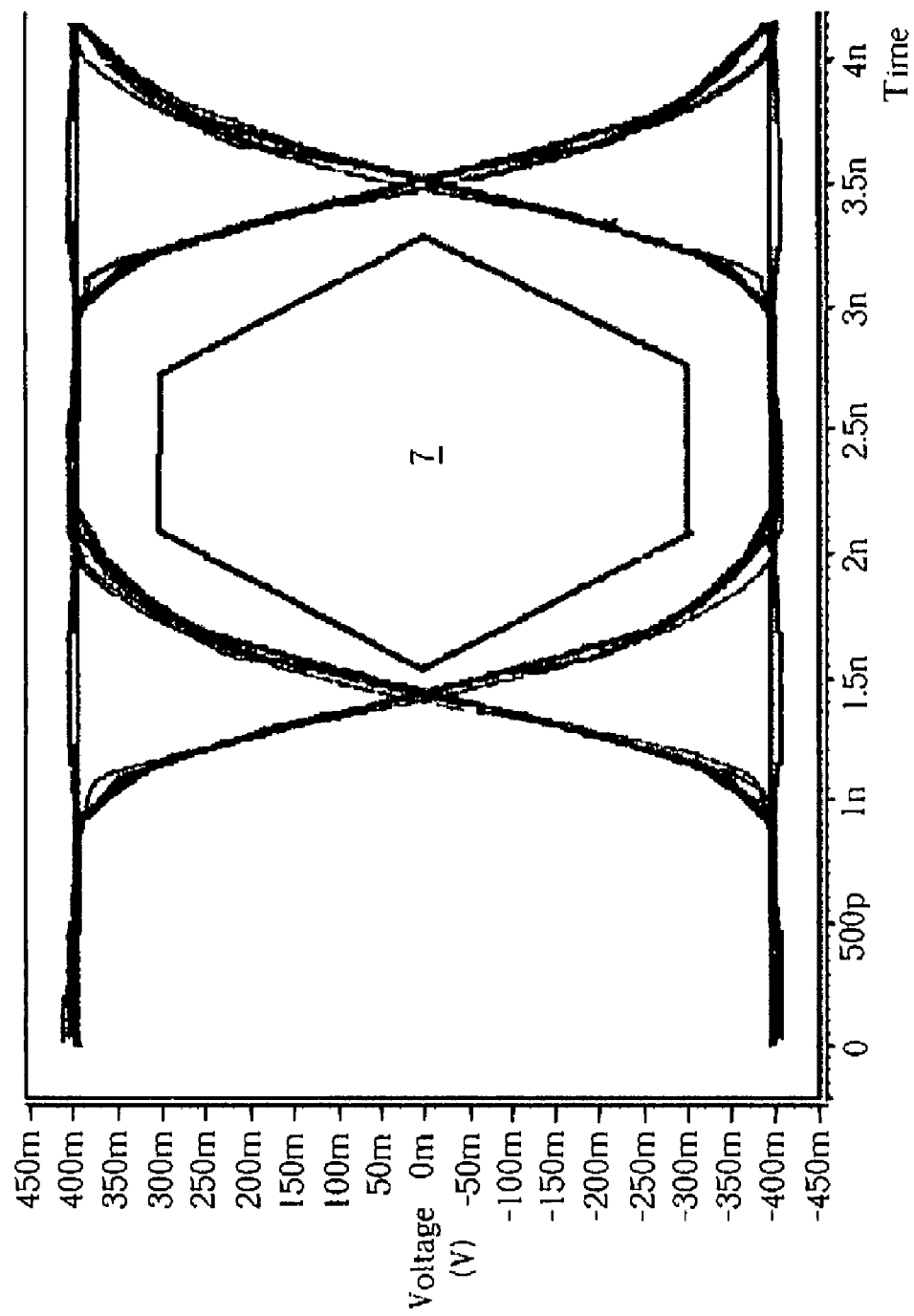

FIG. 10 is a simulated eye diagram when the insulation layer 51 is 40 mil thick, the signal trace is 20 mil wide and the space between each signal trace is 5 mil. FIG. 11 is a simulated eye diagram when the insulation layer 51 is 40 mil thick, the signal trace is 30 mil wide, and the space between each signal trace is 10 mil. A template mask 7 in FIG. 10 and FIG. 11 is a standard simulation for a transmission protocol, used to determine whether signals conform to the specification. To determine whether the signals conform to the specification, a requirement is that the signal cannot overlap with the template mask 7. And, the further away from the template mask 7 the signal is, the better the signal quality of the signal.

A characteristic of eye diagrams is overlap of a sequence of pulses. Therefore, the eye diagram provides repeatability when testing the signal. An increase in noise leads to an increase in signal variation, which leads to thicker overlapping tracks in a vertical direction and increased Bit Error Rate (BER). A horizontal direction of an eye diagram represents a time when the signal arrives, and jitter makes horizontal tracks thicker. Rise time and fall time can be calculated from a transition of a track. Eye diagrams are in shapes of an eye. As the eye opens wider, transmission quality is better, and as the eye gets smaller, the transmission quality worsens.

Figure 12:
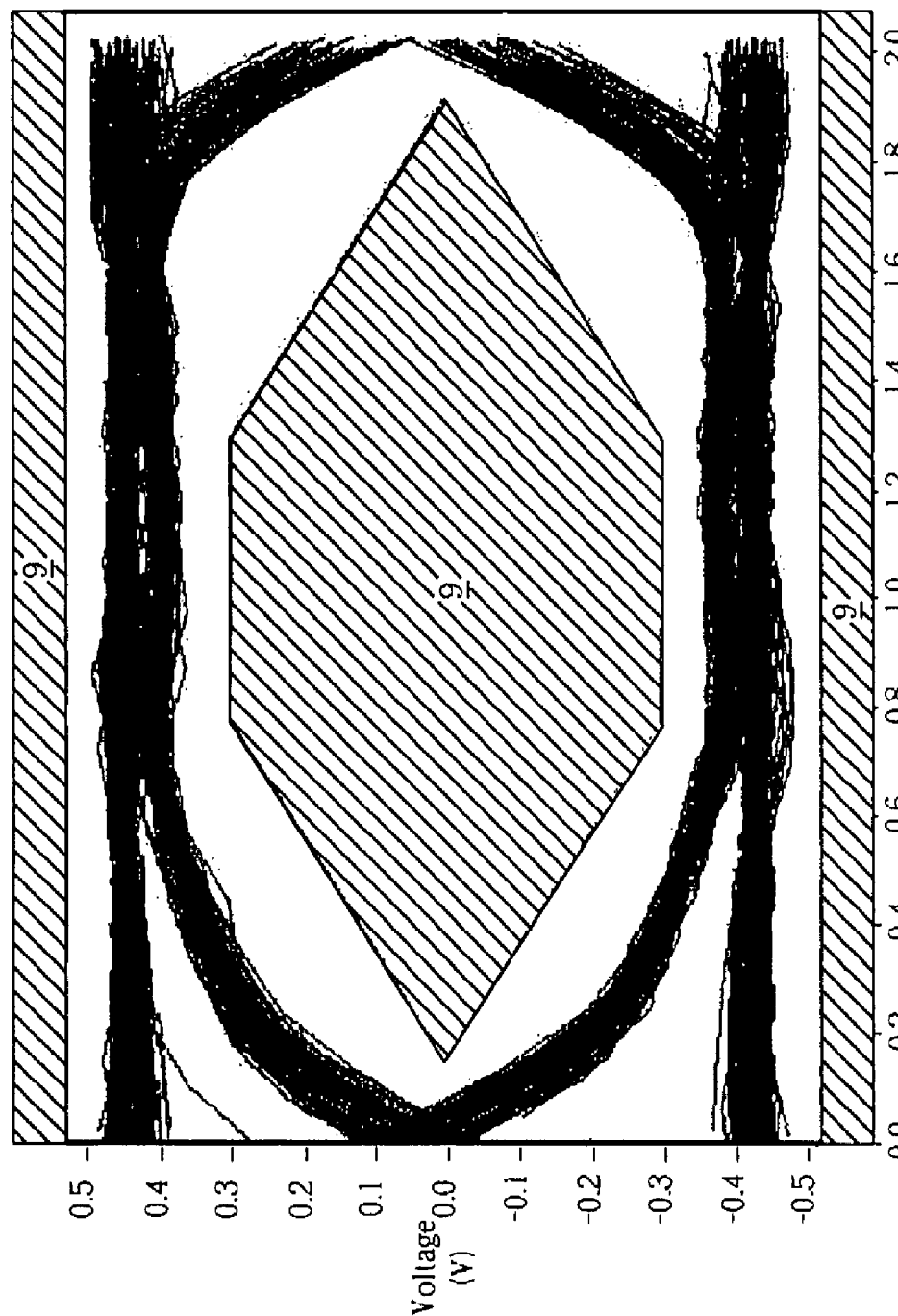
FIG. 12 and FIG. 13 are realistic eye diagrams of FIG. 10 and FIG. 11.
Figure 13:
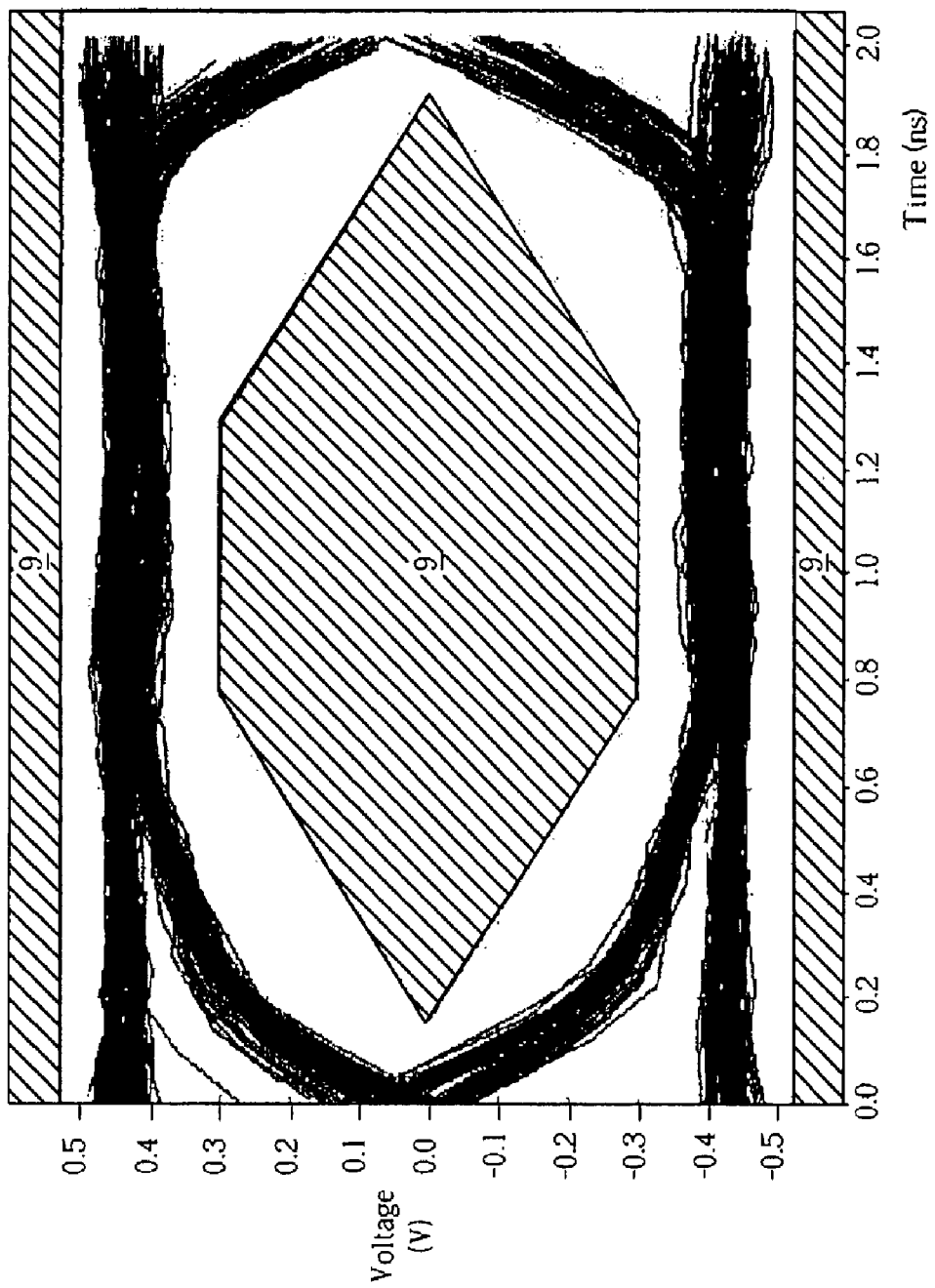

Both eye diagrams of FIG. 10 and FIG. 11 show conformance to the transmission protocol standard, hence simulation data are used for a real test. Results from the real test are as follows. FIG. 12 is an eye diagram of a real test performed according to FIG. 10, and a differential mode impedance measured is between 100.3 Ohms and 102.7 Ohms. FIG. 13 is an eye diagram of the real test performed according to FIG. 11, and a differential mode impedance measured is between 91.85 Ohms and 95.6 Ohms. Differential signals in FIG. 12 and FIG. 13 do not overlap with a template mask 9 (including shaded areas above, below and in the center), therefore the real test results conform to the transmission protocol standard.

From the above simulation and test data, it can be seen that the differential layout of the PCB in the present invention meets the USB 2.0 specification, and it can be applied on a two-layer or a four-layer PCB. PCB thickness and trace width can both be designed to meet different requirements, which adds flexibility to its application. The present invention can also be realized in different fields, such as protocols like PCI express, IEEE 1394, HDMI, DDR2 and Rambus, etc.

Furthermore, in the above embodiment, the present invention is explained in PCB layers, but can also be applied to a layer layout of an IC.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A differential signal layout comprising:
   a first layer comprising:
      a positive differential signal trace; and
      a first ground trace used for matching an impedance of a differential signal;
   a second layer comprising:
      a negative differential signal trace corresponding to the positive differential signal trace; and
      a second ground trace corresponding to the first ground trace and used for matching the impedance of the differential signal; and
   an insulation layer placed between the first layer and the second layer with a predetermined thickness.

2. The differential signal layout of claim 1 further comprising:
   a third ground trace disposed on the first layer and used for matching the impedance of the differential signal, the positive differential trace disposed between the first ground trace and the third ground trace; and
   a fourth ground trace disposed on the second layer and used for matching the impedance of the differential signal, the negative differential trace disposed between the second ground trace and the fourth ground trace.

3. The differential signal layout of claim 2, wherein the positive differential signal trace has a same width as the negative differential signal trace.

4. The differential signal layout of claim 3, wherein a first predetermined space between the positive differential signal trace and the first ground trace, a second predetermined space between the positive differential signal trace and the third ground trace, and a third predetermined space between the negative differential signal trace and the fourth ground trace are all the same.

5. The differential signal layout of claim 4, wherein the first ground trace, the second ground trace, the third ground trace, and the fourth ground trace has a same width.

6. The differential signal layout of claim 5, wherein the insulation layer has a thickness of 40 mil and a width of 20 mil whereas a space between each differential signal trace and each ground trace on a same layer is 5 mil.

7. The differential signal layout of claim 5, wherein the insulation layer has a thickness of 40 mil and a width of 30 mil, whereas a space between each differential signal trace and each ground trace on a same layer is 10 mil.

8. The differential signal layout of claim 5, wherein the insulation layer has a thickness of 10 mil and a width of 10 mil, whereas a space between each differential signal trace and each ground trace on a same layer is 5 mil.

9. The differential signal layout of claim 5, wherein the insulation layer has a thickness of 20 mil and a width of between 10 mil and 15 mil, whereas a space between each differential signal trace and each ground trace on a same layer is 5 mil.

10. The differential signal layout of claim 5, wherein the insulation layer has a thickness of 40 mil and a width of between 10 mil and 30 mil whereas a space between each differential signal trace and each ground trace on a same layer is between 5 mil and 10 mil.

11. The differential signal layout of claim 5, wherein the insulation layer has a thickness of 40 mil and a width of between 15 mil and 45 mil, whereas a space between each differential signal trace and each ground trace on a same layer is between 5 mil and 15 mil.

12. The differential signal layout of claim 1, wherein the positive differential signal trace and the negative differential signal trace have a signal transmission speed that can be higher than 480 Mbps.

13. The differential signal layout of claim 1, wherein a common mode impedance and a differential mode impedance of the positive differential signal trace and the negative differential signal trace conform to a USB 2.0 specification.

14. The differential signal layout of claim 1, wherein a common mode impedance and a differential mode impedance of the positive differential signal trace and the negative differential signal trace conform to a Local Area Network (LAN) protocol specification.

15. The differential signal layout of claim 1, wherein a common mode impedance and a differential mode impedance of the positive differential signal trace and the negative differential signal trace conform to a Low Voltage Differential Signal (LVDS) specification.

16. The differential signal layout of claim 1, wherein a common mode impedance and a differential mode impedance of the positive differential signal trace and the negative differential signal trace conform to a PCI express specification.

17. The differential signal layout of claim 1, wherein a common mode impedance and a differential mode impedance of the positive differential signal trace and the negative differential signal trace conform to an IEEE 1394 specification.

18. The differential signal layout of claim 1, wherein a common mode impedance and a differential mode impedance of the positive differential signal trace and the negative differential signal trace conform to an HDMI specification.

19. The differential signal layout of claim 1, wherein a common mode impedance and a differential mode impedance of the positive differential signal trace and the negative differential signal trace conform to an LVDS DDR2 specification.

20. The differential signal layout of claim 1, wherein a common mode impedance and a differential mode impedance of the positive differential signal trace and the negative differential signal trace conform to an LVDS Rambus specification.

* * * * *